(12) United States Patent
Kho et al.

(10) Patent No.: US 10,394,291 B2
(45) Date of Patent: Aug. 27, 2019

(54) APPARATUS, SYSTEM, AND METHOD FOR DISSIPATING HEAT FROM EXPANSION COMPONENTS

(71) Applicant: Facebook, Inc., Menlo Park, CA (US)

(72) Inventors: Chuankeat Kho, San Jose, CA (US); John Edward Fernandes, Fremont, CA (US); Yueming Li, Mountain View, CA (US)

(73) Assignee: Facebook, Inc., Menlo Park, CA (US)

( * ) Notice: Subject to any disclaimer, the term of this patent is extended or adjusted under 35 U.S.C. 154(b) by 0 days.

(21) Appl. No.: 15/825,703

(22) Filed: Nov. 29, 2017

(65) Prior Publication Data
US 2019/0163245 A1 May 30, 2019

(51) Int. Cl.
G06F 1/20 (2006.01)
H05K 1/11 (2006.01)
H05K 1/18 (2006.01)
H05K 7/20 (2006.01)
H05K 7/14 (2006.01)
H05K 1/02 (2006.01)
(Continued)

(52) U.S. Cl.
CPC ............... *G06F 1/20* (2013.01); *G06F 1/185* (2013.01); *H05K 1/0206* (2013.01); *H05K 1/117* (2013.01); *H05K 1/181* (2013.01); *H05K 7/1402* (2013.01); *H05K 7/20509* (2013.01); *H05K 1/144* (2013.01); *H05K 2201/042* (2013.01); *H05K 2201/066* (2013.01)

(58) Field of Classification Search
CPC ......... G06F 1/20; G06F 1/185; H05K 7/1402; H05K 7/20509; H05K 1/181; H05K 1/117; H05K 1/0206; H05K 2201/042; H05K 2201/066; H05K 1/144; H05K 1/0203; H05K 7/2039; H05K 7/20418; H05K 7/20436; H05K 7/20445; H05K 7/2049; H05K 7/205; H05K 7/20854; H05K 7/209; H05K 7/20963; H05K 2201/10393; H01L 23/40
USPC .................... 361/679.54, 702, 709, 719, 737
See application file for complete search history.

(56) References Cited

U.S. PATENT DOCUMENTS

| | | | | |
|---|---|---|---|---|
| 6,108,731 A | * | 8/2000 | Suzuki | G06F 1/184 710/104 |
| 9,992,912 B1 | * | 6/2018 | Wang | H05K 7/20409 |
| 10,003,153 B1 | * | 6/2018 | Lai | H01R 13/516 |

(Continued)

*Primary Examiner* — Anatoly Vortman
*Assistant Examiner* — Stephen S Sul
(74) *Attorney, Agent, or Firm* — FisherBroyles, LLP

(57) ABSTRACT

An interface adapter may include a printed circuit board that includes an edge connector dimensioned to be inserted into an expansion socket of a computing device. The interface adapter may also include a plurality of modular computing components removably mounted to a top surface of the printed circuit board, where each modular computing component includes a connector dimensioned to be inserted into a socket of the printed circuit board and the connector of each modular computing component includes a pinout that is more compact than a pinout of the edge connector of the printed circuit board. In addition, the interface adapter may include one or more modular heatsinks coupled to a top surface of each modular computing component to facilitate heat dissipation from the top surface of the modular computing component. Various other apparatuses, systems, and methods are also disclosed.

19 Claims, 14 Drawing Sheets

(51) Int. Cl.
*G06F 1/18* (2006.01)
*H05K 1/14* (2006.01)

(56) References Cited

U.S. PATENT DOCUMENTS

| | | | | |
|---|---|---|---|---|
| 2006/0104038 A1* | 5/2006 | Jones | H05K 7/1424 | 361/748 |
| 2008/0271875 A1* | 11/2008 | Lima | H01L 21/4882 | 165/80.3 |
| 2011/0255237 A1* | 10/2011 | Doll | H05K 7/20736 | 361/679.46 |
| 2013/0155623 A1* | 6/2013 | Ma | H01L 23/4093 | 361/720 |
| 2014/0160663 A1* | 6/2014 | Zhou | G06F 13/382 | 361/679.32 |
| 2015/0169013 A1* | 6/2015 | Lai | G06F 1/185 | 361/679.54 |
| 2015/0214725 A1* | 7/2015 | McCallen | H04L 12/10 | 361/86 |
| 2015/0355686 A1* | 12/2015 | Heyd | G06F 1/187 | 361/679.31 |
| 2016/0335220 A1* | 11/2016 | Breakstone | G06F 13/4068 | |
| 2016/0381823 A1* | 12/2016 | Ye | H05K 7/2039 | 361/736 |
| 2018/0138612 A1* | 5/2018 | Lin | G06F 1/185 | |

* cited by examiner

APPARATUS, SYSTEM, AND METHOD FOR DISSIPATING HEAT FROM EXPANSION COMPONENTS

BACKGROUND

As the need for more complex processing and storage of data grows, computing devices frequently require modifications and additional components to accommodate their growing computational needs. Traditionally, these additional components may be added to a computing system to increase the power and speed of the system. For example, a conventional computing system may include expansion slots that allow M.2 expansion cards to be added.

However, the ability to add supplementary components is partially contingent on the amount of physical space available. In the above example, M.2 expansion cards may only be added when there are available slots and the system is equipped to handle the cards. For instance, M.2 cards may traditionally fit horizontally on a printed circuit board, which may quickly run out of space, limiting the number of cards that may be added. In addition, computing systems may not be able to physically accommodate a large variety of expansion components, each with different specifications and requirements. Furthermore, the installation of such components often creates additional sources of heat that could damage the computing system without appropriate cooling. Thus, a better method of installing and dissipating heat from expansion components is needed to support growing demand.

SUMMARY

As will be described in greater detail below, the instant disclosure describes various apparatuses, systems, and methods for dissipating heat from expansion components by modularly mounting expansion components and heatsinks to an interface adapter that, in turn, fits an expansion slot in computing systems. In one example, an interface adapter may include a printed circuit board that includes an edge connector dimensioned to be inserted into an expansion socket of a computing device. The interface adapter may also include a plurality of modular computing components removably mounted to a top surface of the printed circuit board, where each modular computing component includes a connector that is dimensioned to be inserted into a socket of the printed circuit board and the connector of each modular computing component includes a pinout that is more compact than a pinout of the edge connector of the printed circuit board. Additionally, the interface adapter may include one or more modular heatsinks coupled to a top surface of each modular computing component to facilitate heat dissipation from the top surface of the modular computing component.

In some embodiments, each modular computing component may include an expansion card designed to perform a specific computing task. In these embodiments, each modular computing component may also include one or more thermal pads coupled to the expansion card to facilitate heat dissipation from the expansion card.

In some examples, the modular heatsink may be coupled to the top surface of the modular computing component by inserting a protrusion at a distal end of the modular heatsink to a slot in a distal mounting bracket on the printed circuit board and locking a latch at a proximal end of the modular heatsink to a proximal mounting bracket on the printed circuit board. In these examples, the protrusion at the distal end of the modular heatsink may be dimensioned to wedge under each modular computing component such that the protrusion provides leverage to lift a single modular computing component for removal. Additionally, the latch at the proximal end of the modular heatsink may include a handle that fits to a ledge of the proximal mounting bracket to lock the latch and a compression spring in the latch that exerts a tension between the handle and the modular heatsink to maintain a locked position of the latch. Furthermore, in these examples, a force applied horizontally to the handle may compress the compression spring such that the handle unlocks from the ledge of the proximal mounting bracket for removal of the modular heatsink.

In one embodiment, a secondary heatsink may be coupled to a bottom surface of the printed circuit board to facilitate heat dissipation from bottom surfaces of the plurality of modular computing components. In this embodiment, a plurality of thermal vias, dimensioned as through holes in the printed circuit board, may transfer heat from the bottom surfaces of the plurality of modular computing components to the secondary heatsink.

According to various embodiments, a corresponding computing system may include a central processing unit and one or more expansion sockets. The computing system may also include one or more interface adapters with an edge connector that is dimensioned to be inserted into an expansion socket, where the interface adapter may include a plurality of modular computing components removably mounted to a printed circuit board of the interface adapter and one or more modular heatsinks coupled to a top surface of each modular computing component to facilitate heat dissipation from the top surface of the modular computing component.

In one example, the edge connector of the interface adapter may couple the plurality of modular computing components to a computing bus that connects the expansion socket to the central processing unit.

In one embodiment, each modular computing component may include (1) an expansion card designed to perform a specific computing task, (2) one or more thermal pads coupled to the expansion card to facilitate heat dissipation from the expansion card, and (3) a connector that is dimensioned to be inserted into a socket of the printed circuit board. In this embodiment, the connector of each modular computing component may include a pinout that is more compact than a pinout of the edge connector of the interface adapter.

In some examples, the modular heatsink may be coupled to the top surface of the modular computing component by inserting a protrusion at a distal end of the modular heatsink to a slot in a distal mounting bracket on the interface adapter. In these examples, the heatsink may also be coupled to the modular computing component by locking a latch at a proximal end of the modular heatsink to a proximal mounting bracket on the interface adapter.

In some embodiments, the above system may further include a secondary heatsink coupled to a bottom surface of the interface adapter to facilitate heat dissipation from bottom surfaces of the plurality of modular computing components. In these embodiments, a plurality of thermal vias, dimensioned as through holes in the printed circuit board of the interface adapter, may transfer additional heat from the bottom surfaces of the plurality of modular computing components to the secondary heatsink.

In addition to the various systems and apparatuses described herein, the instant disclosure presents exemplary methods for dissipating heat from expansion components. For example, a corresponding method may include removably mounting a plurality of modular computing components to a top surface of a printed circuit board of an interface adapter. In this example, the printed circuit board may include an edge connector dimensioned to be inserted into an expansion socket of a computing device, each modular computing component may include a connector that is dimensioned to be inserted into a socket of the printed circuit board, and the connector of each modular computing component may include a pinout that is more compact than a pinout of the edge connector of the printed circuit board. The method may also include removably coupling one or more modular heatsinks to a top surface of each modular computing component to facilitate heat dissipation from the top surface of the modular computing component.

In one embodiment, each modular computing component in the above method may include an expansion card designed to perform a specific computing task. The modular computing component may additionally include one or more thermal pads coupled to the expansion card to facilitate heat dissipation from the expansion card.

In some examples, removably coupling the modular heatsink to the top surface of each modular computing component may include inserting a protrusion at a distal end of the modular heatsink to a slot in a distal mounting bracket on the printed circuit board. In these examples, removably coupling the modular heatsink to the modular computing component may also include locking a latch at a proximal end of the modular heatsink to a proximal mounting bracket on the printed circuit board.

In some embodiments, the above method may further include coupling a secondary heatsink to a bottom surface of the printed circuit board to facilitate heat dissipation from bottom surfaces of the plurality of modular computing components. In these embodiments, the method may also include dimensioning a plurality of thermal vias as through holes in the printed circuit board to transfer heat from the bottom surfaces of the plurality of modular computing components to the secondary heatsink.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
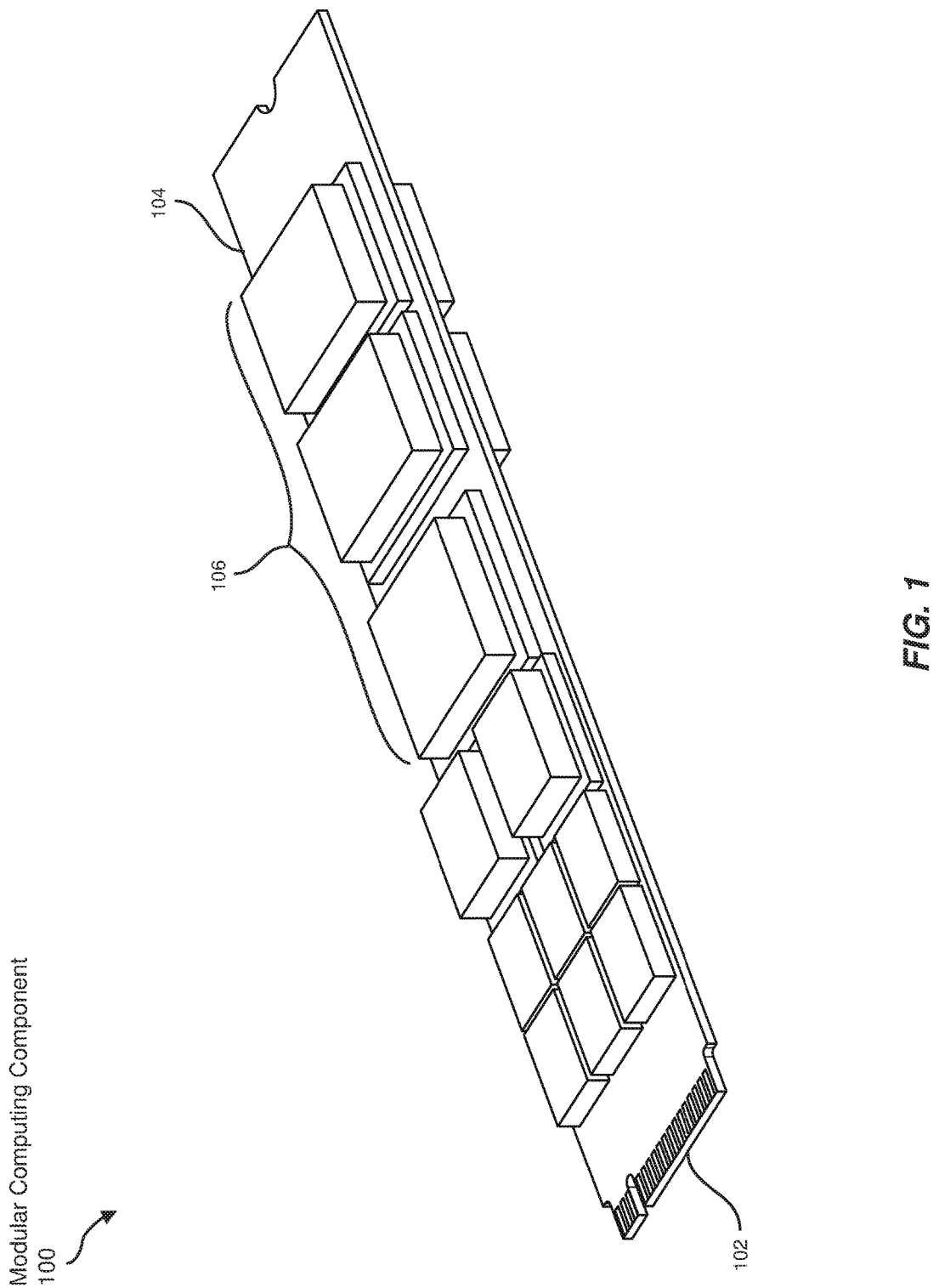
FIG. 1 is a perspective view of an example modular computing component.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes and illustrates various apparatuses, systems, and methods for dissipating heat from expansion components. As will be explained in greater detail below, embodiments of the instant disclosure may improve the installation of various expansion components by first modularly mounting the components to an interface adapter that fits into an expansion slot in a computing system. For example, M.2 components may be mounted to the interface adapter, which may then be mounted to a Peripheral Component Interconnect Express (PCIe) slot on a computing device. Thermal pads may be fitted to the surface of the expansion components to provide initial heat dissipation from the components. Modular heatsinks may then be mounted on the interface adapter on top of the expansion components to provide additional dissipation of heat from the thermal pads. The disclosed embodiments may also include a secondary heatsink on the bottom of the interface adapter to provide heat dissipation from the bottom sides of the expansion components. Additionally, a printed circuit board of the interface adapter may be dimensioned with a multitude of thermal vias to direct heat from the bottom sides of the expansion components to the secondary heatsink. Thus, the disclosed embodiments may provide improved heat dissipation while permitting more modular and compact installation of expansion components.

Figure 2:
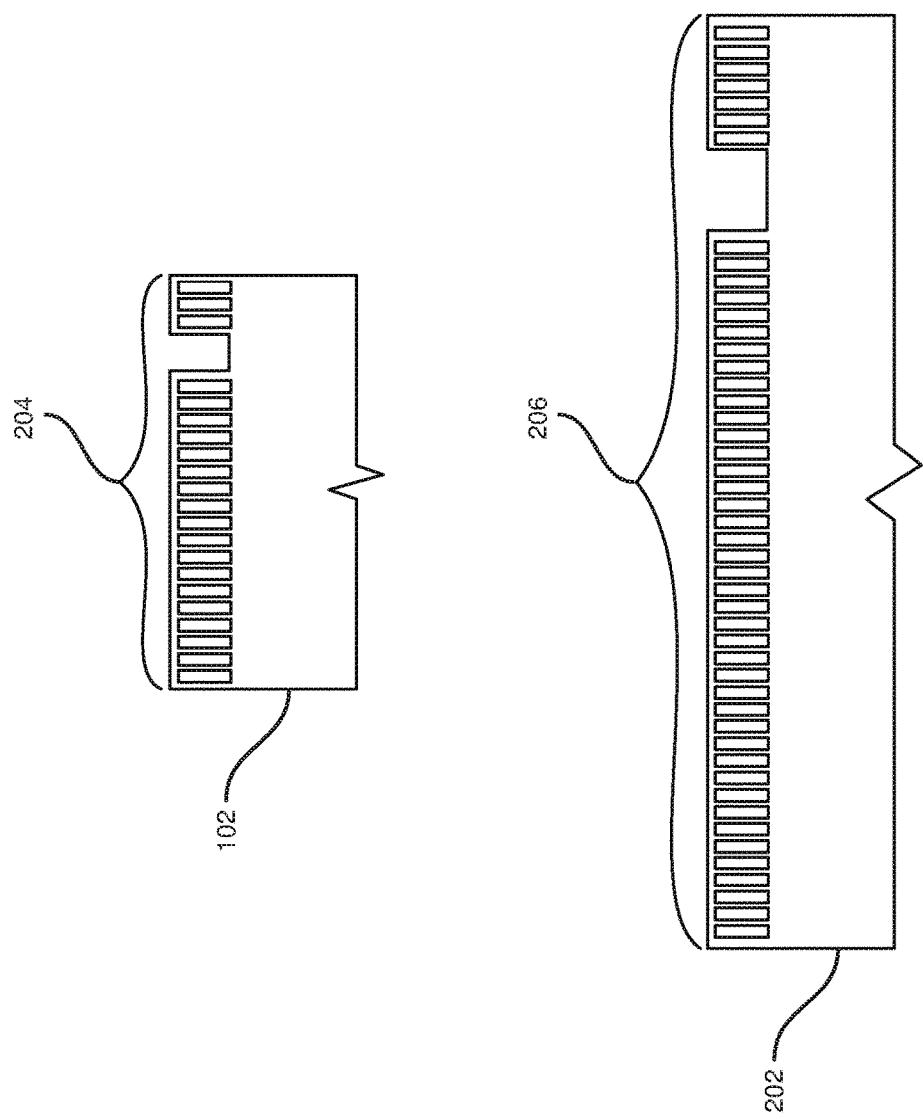
FIG. 2 is a top view of a comparison between a modular computing component connector pinout and a printed circuit board edge connector pinout.

The following will provide, with reference to FIGS. 1-2, detailed descriptions of modular computing components. In addition, the discussion associated with FIGS. 3-5 will provide detailed descriptions of a modular heatsink. The discussion corresponding to FIGS. 6-10 will provide examples of modular computing components and modular heatsinks mounted to an interface adapter. Additionally, the discussion associated with FIGS. 11-12 will provide examples of thermal vias used in a printed circuit board.

Figure 13:
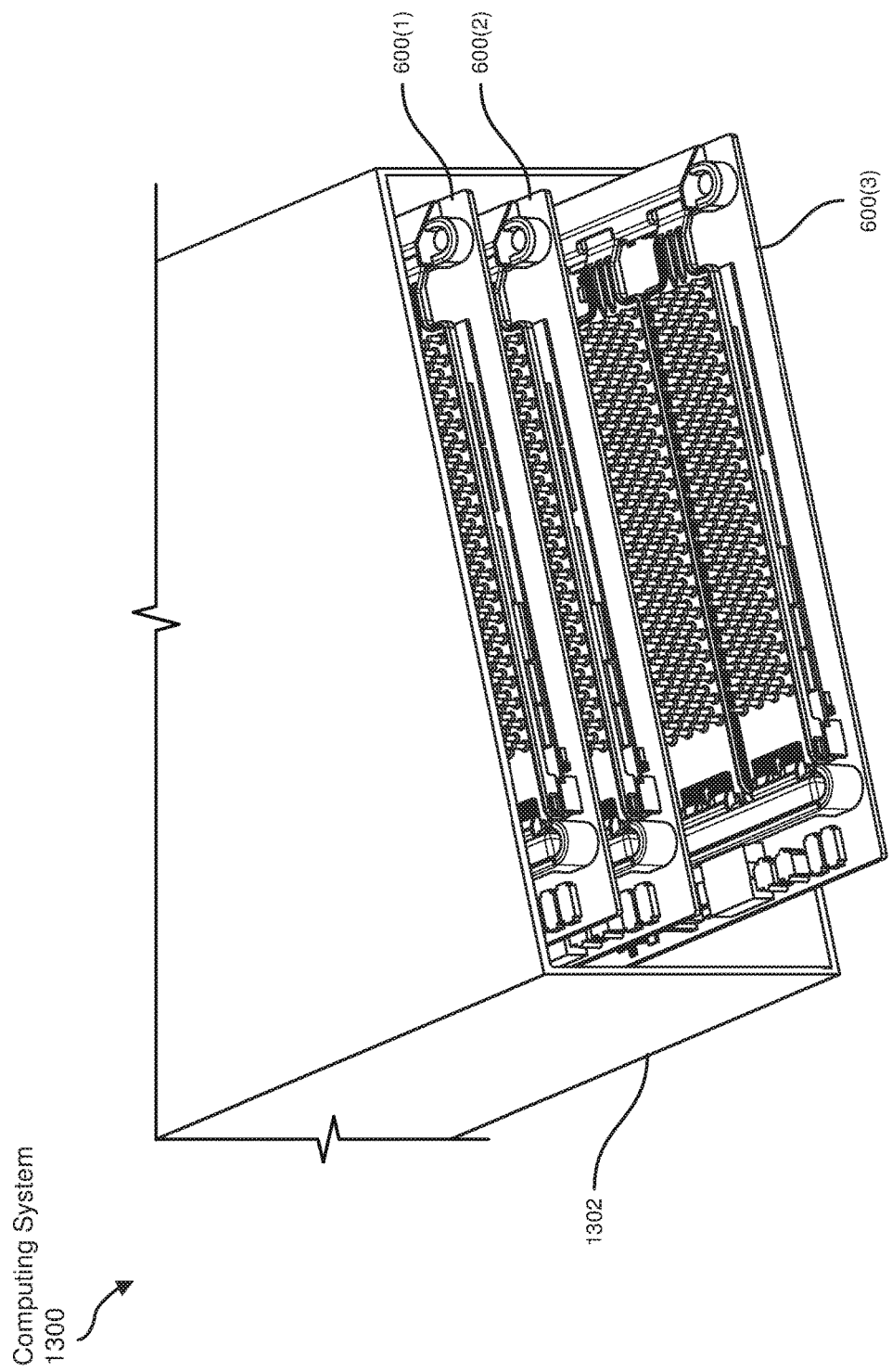
FIG. 13 is a partial perspective view of a computing system installed with multiple interface adapters.

Furthermore, the discussion associated with FIG. 13 will provide examples of computing systems that incorporate interface adapters. Finally, the discussion corresponding to FIG. 14 will provide examples of methods for manufacturing, assembling, configuring, and/or using the interface adapters presented herein.

FIG. 1 illustrates a perspective view of a modular computing component 100. In some examples, modular computing component 100 may include an expansion card 104 designed to perform a specific computing task. In some examples, the term "expansion card" generally refers to a component, such as a card formed from a printed circuit board, that is configured for insertion into a corresponding computing device or expansion socket to expand the functionality of the computing device. In the above examples, modular computing component 100 may also include a plurality of thermal pads 106 coupled to expansion card 104 to facilitate heat dissipation from expansion card 104. The term "thermal pad," in some examples, generally refers to a pad of solid material, such as silicone or paraffin wax, that facilitates transfer of heat away from a computing component. As illustrated in FIG. 1, thermal pads 106 may be positioned on both sides of expansion card 104 to conduct heat from the two sides.

Additionally, in some examples, modular computing component 100 may include a connector 102 dimensioned to be inserted into a socket of a printed circuit board. The terms "connector" and "edge connector," in some examples, generally refer to one or more connections at an edge of an expansion component that couple the component to a corresponding computing bus or computing device. In some examples, a connector or an edge connector may be formed from a portion of a printed circuit board and/or include traces or pins designed to connect to a matching socket. The term "printed circuit board," in some examples, generally refers to a physical board on which computing components may be attached or embedded such that the board provides electrical connections between the computing components.

FIG. 2 illustrates a top view of a comparison between a pinout 204 of connector 102 for modular computing component 100 and a pinout 206 of an edge connector 202 of a printed circuit board. The term "pinout," in some examples, generally refers to a cross-reference between the contacts, or pins, of an electrical connector or electronic component. In some examples, edge connector 202 may be dimensioned to be inserted into an expansion socket of a computing device.

In one embodiment, connector 102 of modular computing component 100 may include a pinout 204 that is more compact than a pinout 206 of edge connector 202 of the printed circuit board. A compact pinout may be more compact than another pinout by having a narrower, thinner, or otherwise smaller dimension than the other pinout and/or by containing fewer or smaller pins. For example, pinout 204 of connector 102 may conform to M.2 specifications for pinouts and pinout 206 of edge connector 202 may conform to PCIe bus standards of pinouts, where M.2 standards are more compact than PCIe slots.

Figure 3:
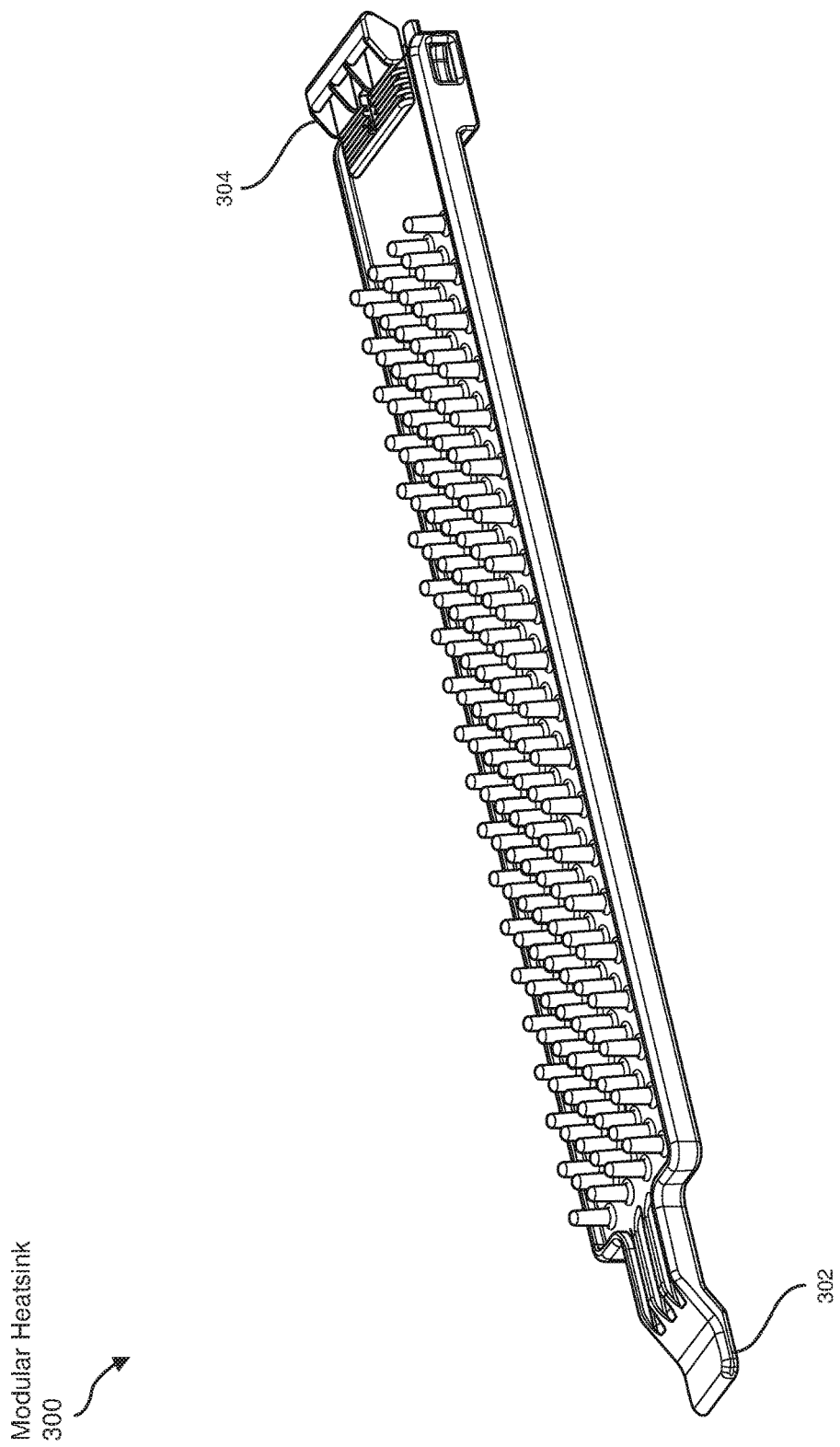
FIG. 3 is a perspective view of an example modular heatsink.

FIG. 3 illustrates a perspective view of a modular heatsink 300. In some examples, the term "heatsink" generally refers to an apparatus that absorbs and transfers heat from a device to fluid or air, thereby cooling the device through a process of thermal transfer. As shown in FIG. 3, modular heatsink 300 may include a plurality of protruding pins to increase surface area for dissipation of heat to cooling airflow. Alternatively, modular heatsink 300 may include other components, such as fins, to facilitate the transfer of heat from modular heatsink 300 to cooling airflow.

In some examples, modular heatsink 300 may include a protrusion 302 at a distal end of modular heatsink 300 dimensioned to insert into a slot for mounting. In these examples, modular heatsink 300 may also include a latch 304 at a proximal end of modular heatsink 300 that locks during mounting.

Figure 4:
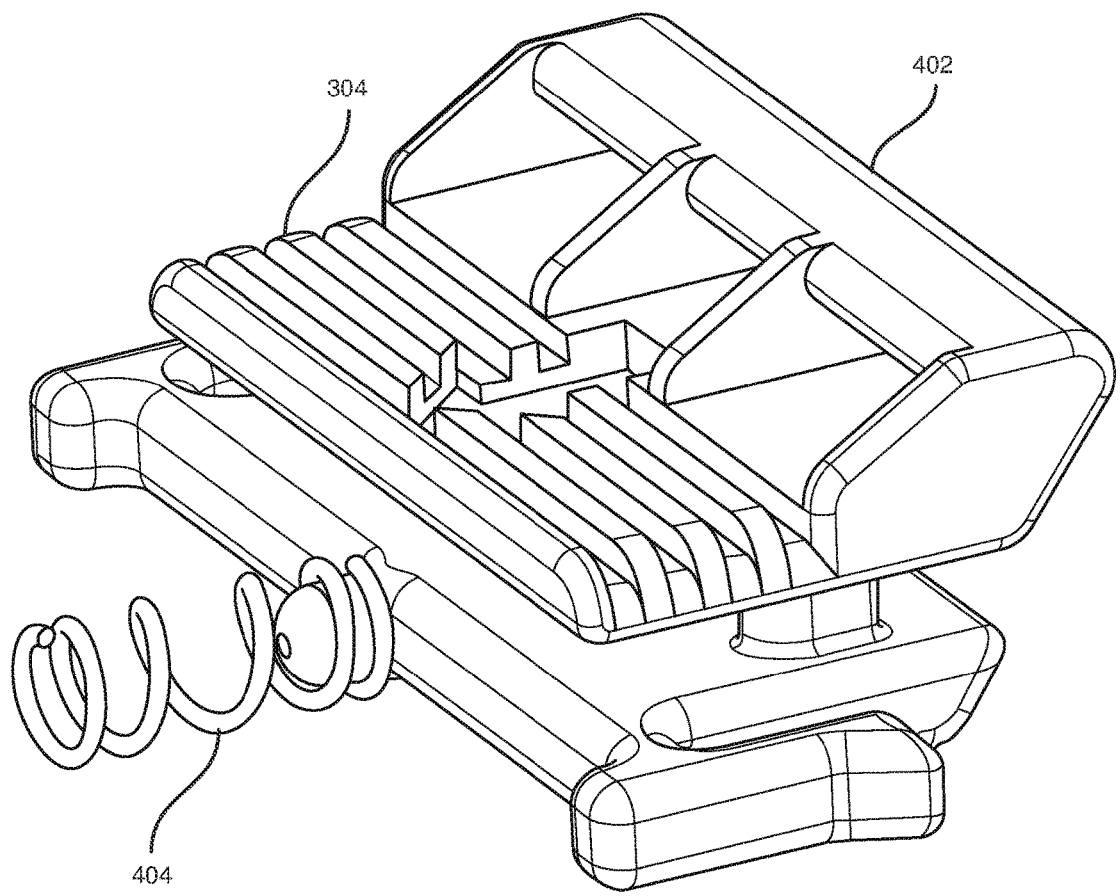
FIG. 4 is a perspective view of an example latch for a modular heatsink.

FIG. 4 illustrates a perspective view of latch 304 for locking modular heatsink 300. In some embodiments, latch 304 may include a handle 402 that fits to a ledge of a mounting bracket to lock latch 304 in place. In these embodiments, latch 304 may additionally include a compression spring 404 that exerts a tension between handle 402 and the body of modular heatsink 300 to maintain a locked position of latch 304. The term "compression spring," in some examples, generally refers to a coil that resists compression and exerts an opposite force or tension to maintain an original shape.

Figure 5:
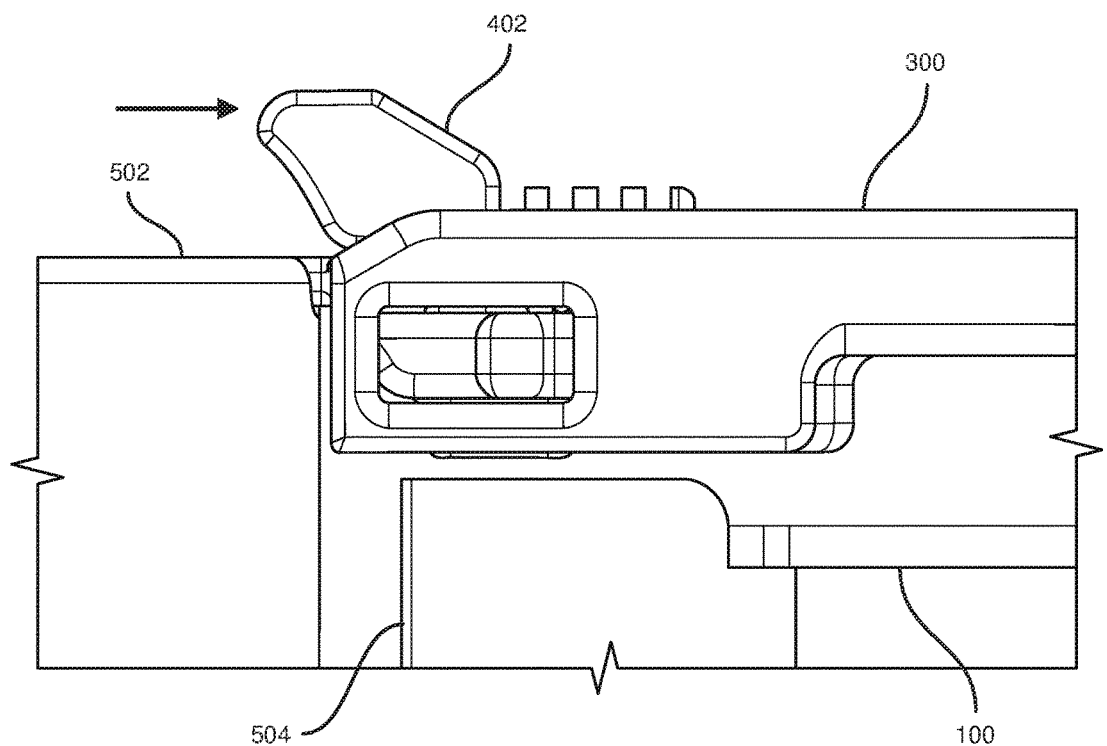
FIG. 5 is a partial side view of a modular heatsink unlocked from a proximal bracket by a force on a handle of the modular heatsink.

FIG. 5 illustrates a partial side view of modular heatsink 300 unlocked from a proximal mounting bracket 502 by a force on handle 402 of modular heatsink 300. In one example, handle 402 initially fits to the ledge of proximal mounting bracket 502 to couple modular heatsink 300 to modular computing component 100 mounted to a socket 504. In this example, the force applied horizontally to handle 402 may compress compression spring 404 of FIG. 4 inside modular heatsink 300 such that handle 402 unlocks from the ledge of proximal mounting bracket 502. Subsequently, modular heatsink 300 may be removed and uncoupled from modular computing component 100.

Figure 6:
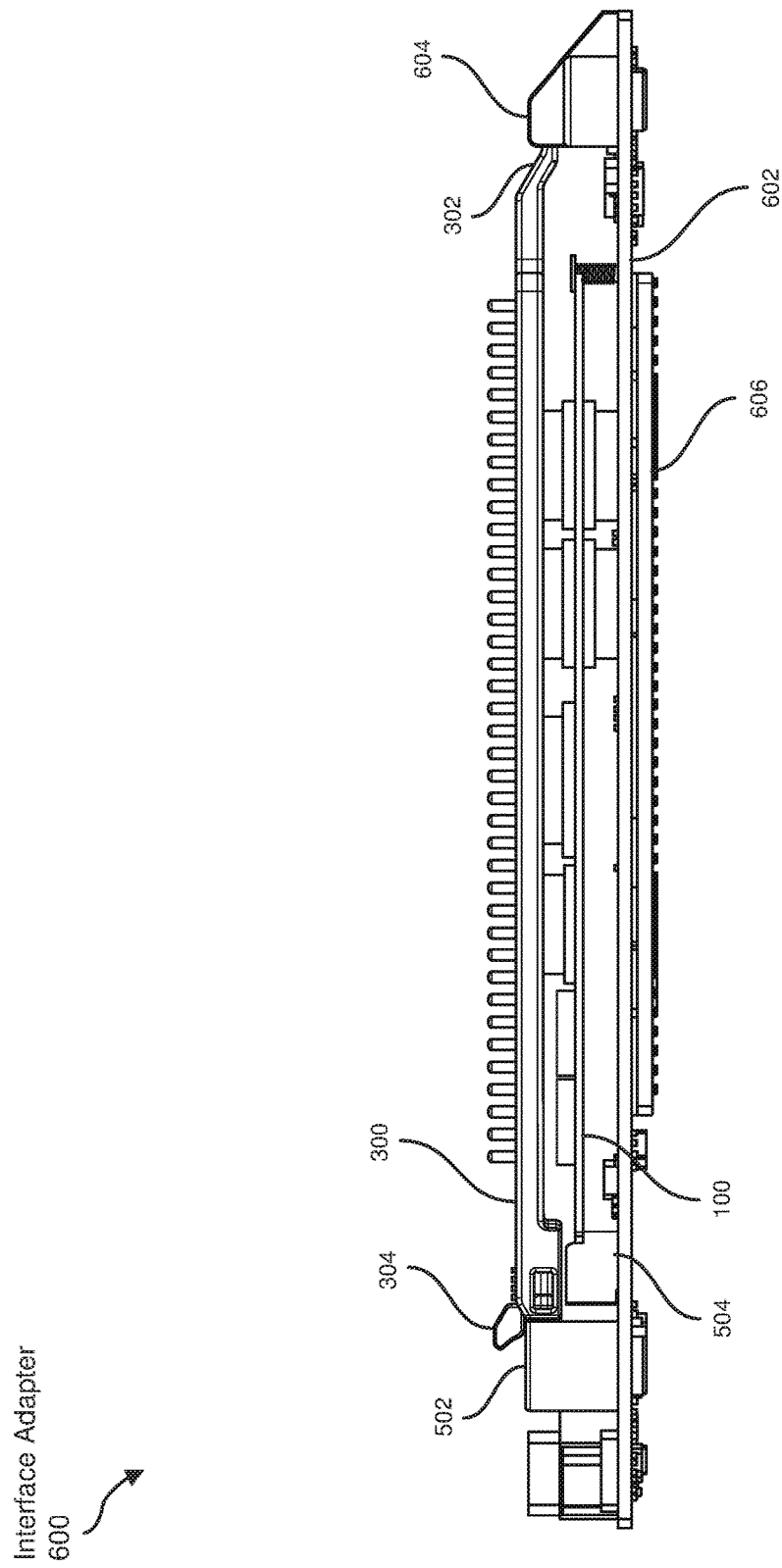
FIG. 6 is a side view of a modular heatsink coupled to a modular computing component on a printed circuit board.

FIG. 6 illustrates a side view of modular heatsink 300 coupled to modular computing component 100 on a printed circuit board 602 of an interface adapter 600. In some examples, the term "interface adapter" generally refers to an expansion card that includes one or more expansion sockets or slots dimensioned to accept an additional expansion card in a nested fashion. Notably, an interface adapter may be dimensioned to fit an expansion socket of different specifications than the expansion sockets on the interface adapter, thereby acting as an adapter between types of expansion sockets.

In one embodiment, modular computing component 100 may be removably mounted to a top surface of printed circuit board 602 by inserting connector 102 of FIG. 1 into socket 504. Socket 504 may electronically couple modular computing component 100 to printed circuit board 602. In the example of FIG. 6, modular computing component 100 may be physically mounted at one end using a screw. Alternatively, modular computing component 100 may be mounted to printed circuit board 602 with latches, pins, bolts, or other appropriate fixtures. In these embodiments, modular heatsink 300 may then be coupled to a top surface of modular computing component 100 to facilitate heat dissipation from the top surface of modular computing component 100. In the example of FIG. 6, thermal pads 106 of modular computing component 100, as shown in FIG. 1, may additionally facilitate transfer of heat from modular computing component 100 to modular heatsink 300 on the top and printed circuit board 602 on the bottom.

In the above embodiment, modular heatsink 300 may be coupled to the top surface of modular computing component 100 by inserting protrusion 302 in a distal mounting bracket 604 on printed circuit board 602 of interface adapter 600. Additionally, modular heatsink 300 may be coupled by locking latch 304 to proximal mounting bracket 502 on printed circuit board 602. Distal mounting bracket 604 and proximal mounting bracket 502 may be dimensioned to ensure thermal pads 106 of modular computing component 100 maintain contact with a bottom surface of modular heatsink 300.

In further embodiments, a secondary heatsink 606 may be coupled to a bottom surface of printed circuit board 602 to facilitate heat dissipation from a bottom surface of modular computing component 100. Secondary heatsink 606 may represent various types of heatsinks and may include pins, fins, or other structures to increase surface area for improved heat dissipation.

Figure 7:
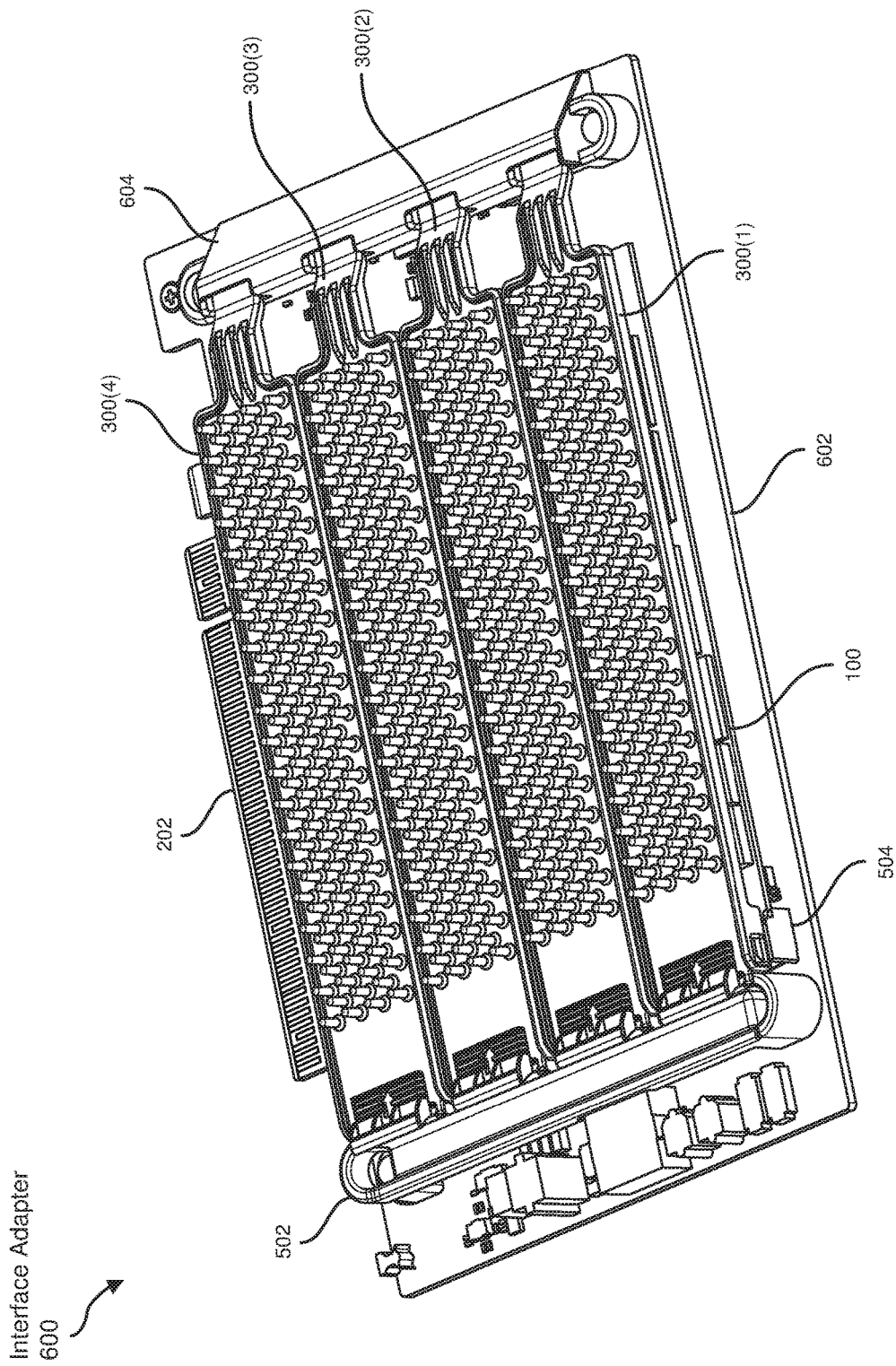
FIG. 7 is a perspective view of an interface adapter with multiple modular heatsinks coupled to multiple modular computing components.

FIG. 7 illustrates a perspective view of interface adapter 600 with multiple modular heatsinks 300(1), 300(2), 300(3), and 300(4) coupled to modular computing components such as modular computing component 100. In this example, printed circuit board 602 of interface adapter 600 may include edge connector 202 dimensioned to be inserted into an expansion socket of a computing device. In an alternate example, edge connector 202 may represent a connector separately coupled to printed circuit board 602.

Figure 8:
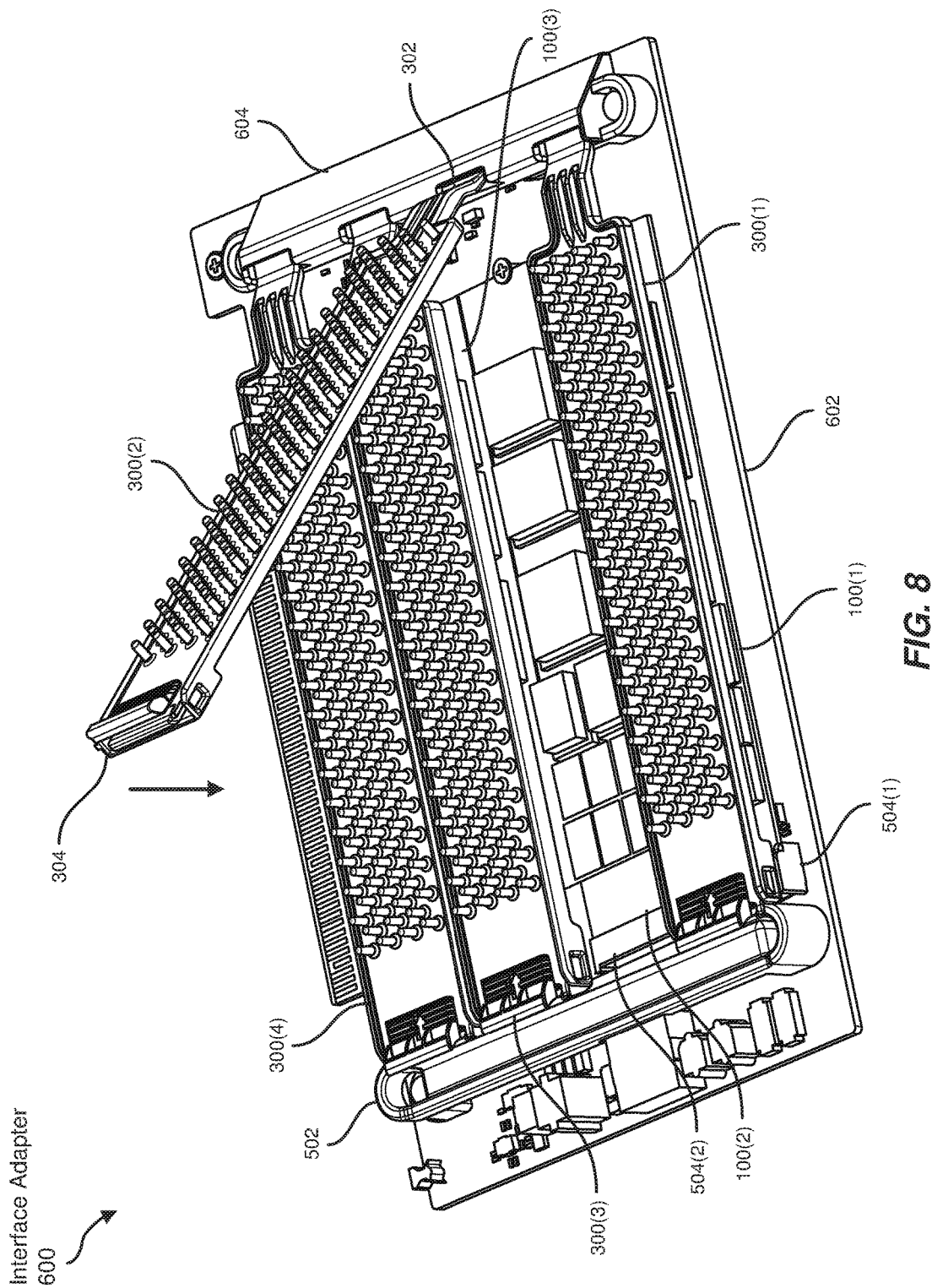
FIG. 8 is a perspective view of the installation of a modular heatsink to an interface adapter.

FIG. 8 illustrates a perspective view of the installation of modular heatsink 300(2) to interface adapter 600. In one embodiment, modular computing components 100(1), 100(2), and 100(3) may be coupled to printed circuit board 602 by sockets, such as sockets 504(1) and 504(2). In this embodiment, modular heatsink 300(2) may then be installed by first inserting protrusion 302 into distal mounting bracket 604. A downward force may then be applied to modular heatsink 300(2) such that latch 304 locks to proximal mounting bracket 502. In this embodiment, the downward force may compress latch 304 until latch 304 fits around a ledge of proximal mounting bracket 502 to lock in place. Although illustrated as a single modular heatsink coupled to each modular computing component, alternate configurations of interface adapter 600 may include multiple modular heatsinks coupled to each modular computing component.

Figure 9:
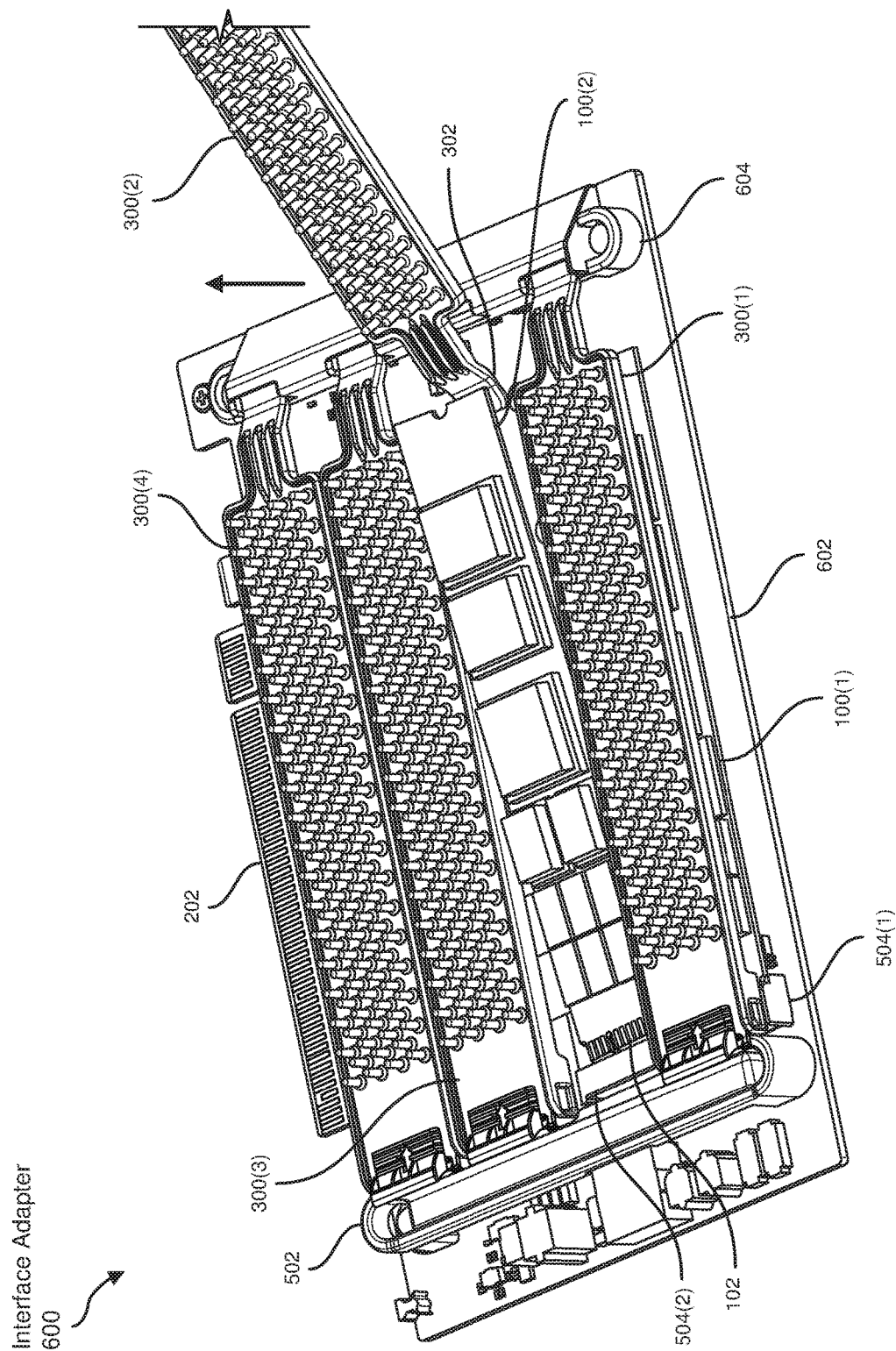
FIG. 9 is a perspective view of the use of a distal end of a modular heatsink to remove a modular computing component.

FIG. 9 illustrates a perspective view of the use of a distal end of modular heatsink 300(2) to remove modular computing component 100(2). In some examples, protrusion 302 may be dimensioned to wedge under modular computing component 100(2) such that protrusion 302 provides leverage to life modular computing component 100(2) for removal. In these examples, protrusion 302 may be used for modular computing components in positions that are difficult to remove by hand, such as the position of modular computing component 100(2) between modular computing component 100(1) and modular computing component 100(3). Thus, protrusion 302 of modular heatsink 300(2) may enable removal of modular computing component 100(2) without removing other modular heatsinks or other modular computing components. Furthermore, as illustrated in FIG. 9, connector 102 of modular computing component 100(2) may be more compact, both in physical dimensions and in the number and dimension of pins, than edge connector 202 of printed circuit board 602.

Figure 10:
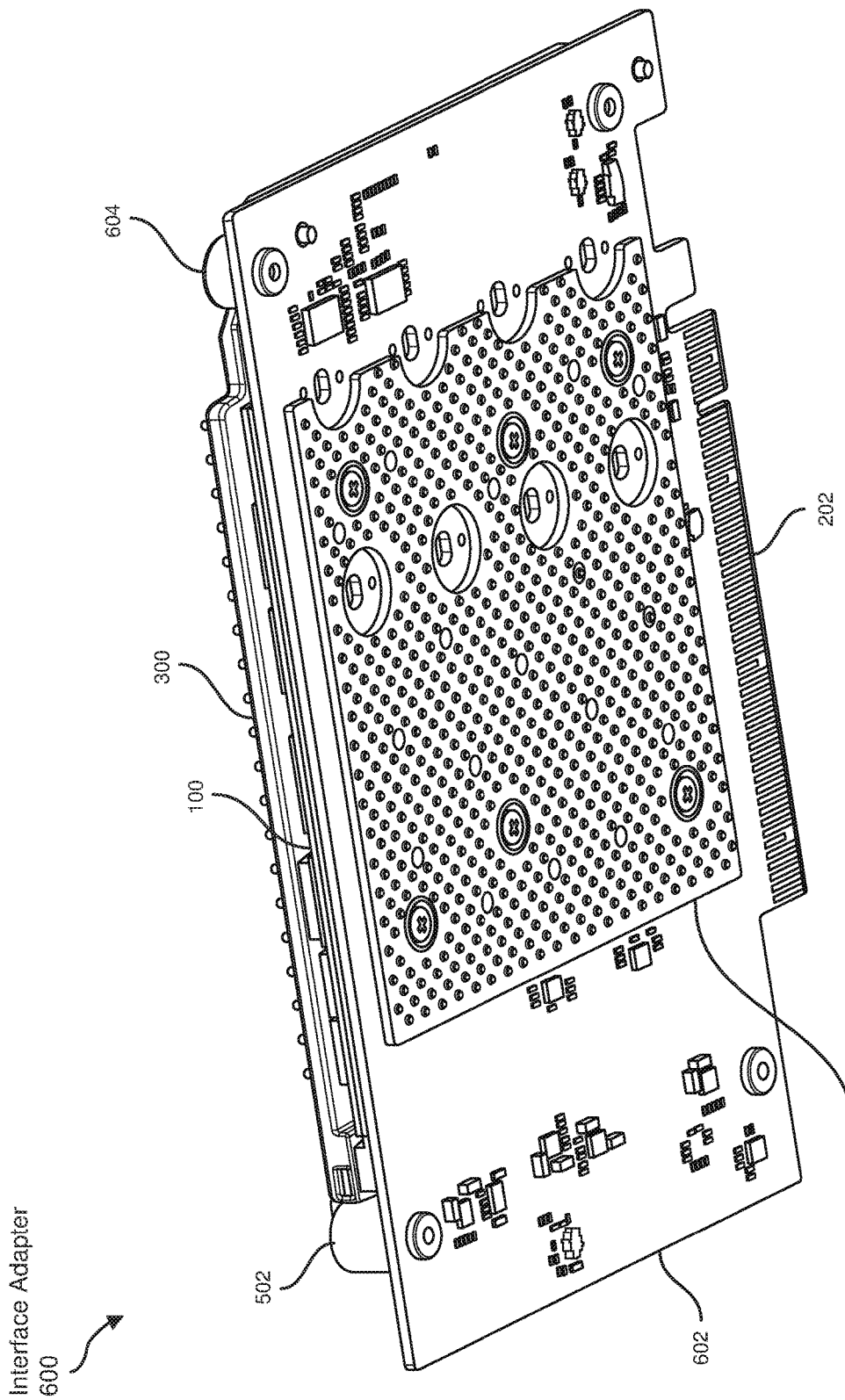
FIG. 10 is a perspective view of a secondary heatsink coupled to the bottom of an interface adapter.

FIG. 10 illustrates a perspective view of secondary heatsink 606 coupled to the bottom of interface adapter 600. In this example, secondary heatsink 606 may represent a single heatsink coupled to the bottom surface of printed circuit board 602 to facilitate heat dissipation from the bottom surfaces of a plurality of modular computing components, such as modular computing components 100(1)-(3) in FIG. 8. In alternate examples, multiple secondary heatsinks may be coupled to the bottom of interface adapter 600. Additionally, although illustrated as mounted to printed circuit board 602 using a plurality of screws, secondary heatsink 606 may alternatively be mounted to printed circuit board 602 using other methods and/or physical fixtures.

Figure 11:
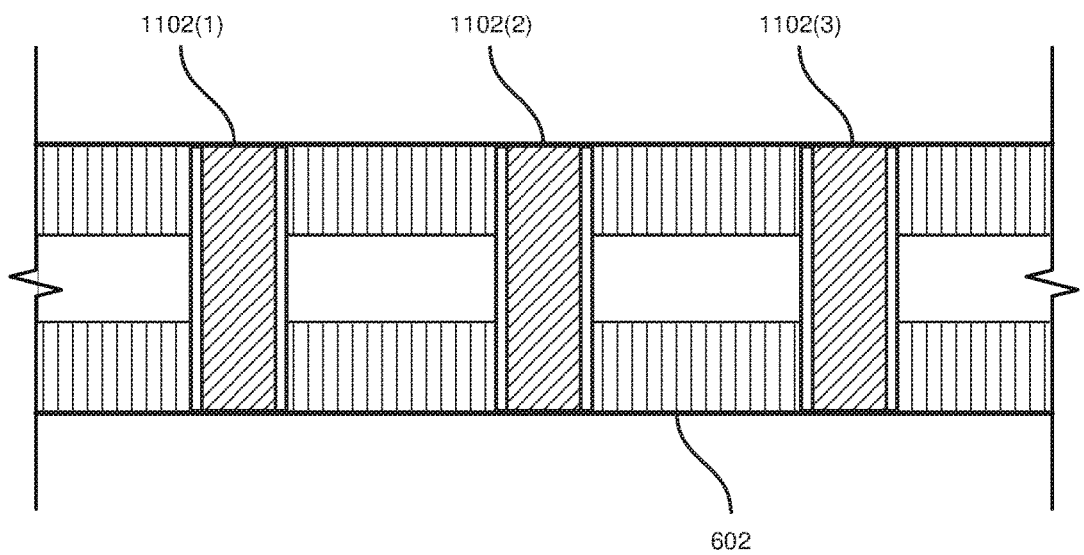
FIG. 11 is a sectional view of multiple thermal vias in a printed circuit board.

FIG. 11 illustrates a sectional view of multiple thermal vias 1102(1), 1102(2), and 1102(3) in printed circuit board 602. The term "thermal via," in some examples, generally refers to an electrical connection running through electronic circuitry to conduct and direct heat away from a component. Thermal vias may also be constructed from conducive material to more easily transfer heat. For example, thermal vias 1102(1)-(3) may represent copper vias that extend through multiple layer of printed circuit board 602. Additionally or alternatively, thermal vias 1102(1)-(3) may be hollowed to improve transfer of air and/or heat. Thus, thermal vias 1102(1)-(3) may transfer heat from one side of printed circuit board 602 to the other side of printed circuit board 602.

Figure 12:
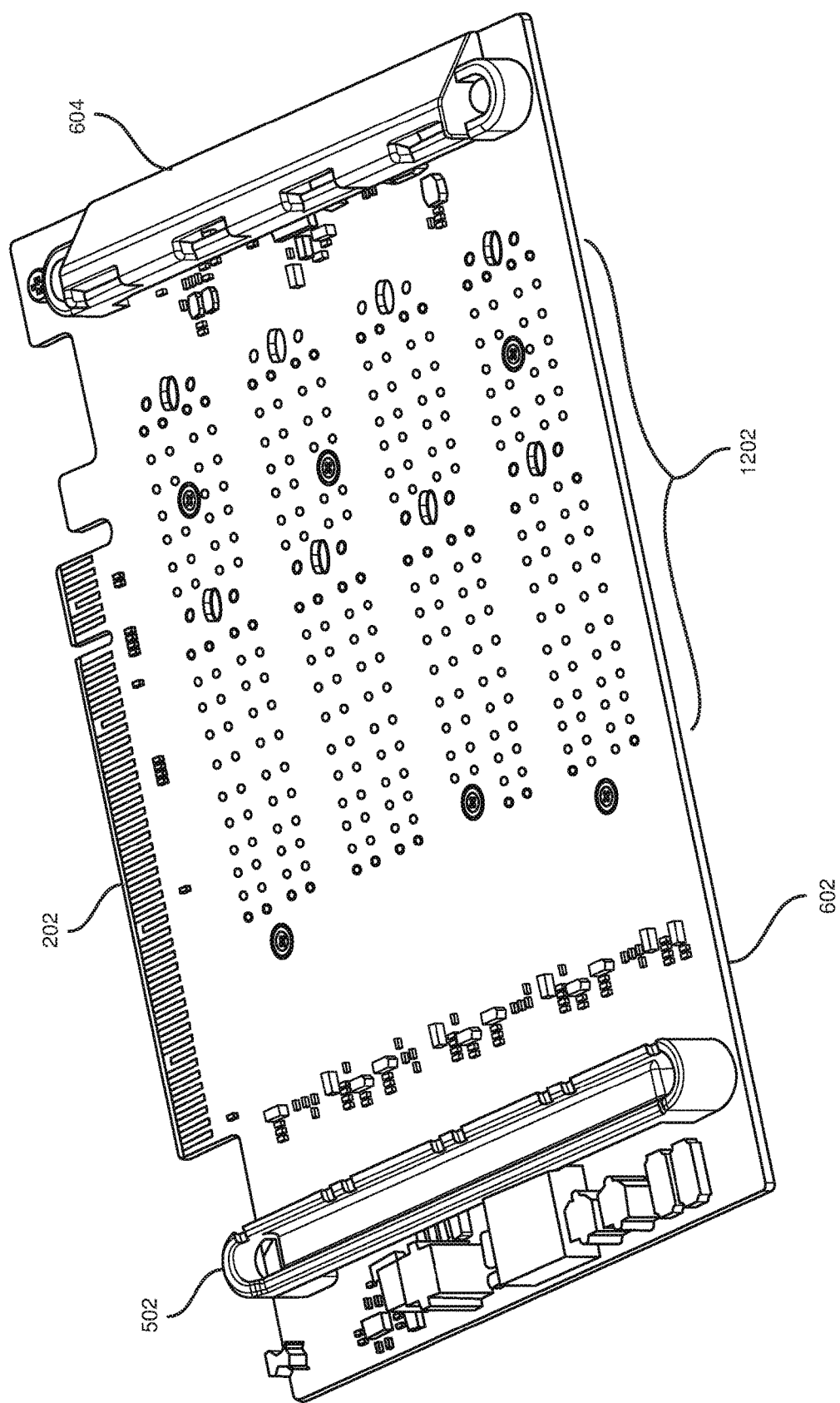
FIG. 12 is a perspective view of a printed circuit board dimensioned with a plurality of thermal vias.

FIG. 12 illustrates a perspective view of printed circuit board 602 dimensioned with a plurality of thermal vias 1202. In one example, plurality of thermal vias 1202 may include thermal vias 1102(1)-(3) of FIG. 11. In this example, plurality of thermal vias 1202 may be dimensioned as through holes in printed circuit board 602 of interface adapter 600 to facilitate heat transfer from the bottom surfaces of modular computing components 100(1)-(3) of FIG. 8 to secondary heatsink 606 of FIG. 10. Furthermore, plurality of thermal vias 1202 may be positioned in rows corresponding to the positions of modular computing components 100(1)-(3).

FIG. 13 illustrates a partial perspective view of a computing system 1300 installed with multiple interface adapters 600(1), 600(2), and 600(3). Computing system 1300 may represent and/or include a computing device, a server, a storage device, and/or other computing components. Although not illustrated, in one embodiment, computing system 1300 may include a central processing unit. Alternatively, computing system 1300 may be implemented as a rack, such as a data-center rack, that may include multiple expansion slots and/or multiple central processing units.

In some embodiments, computing system 1300 may also include an expansion socket 1302, and interface adapters 600(1)-(3) may include edge connectors, such as edge connector 202 of FIG. 7, dimensioned to be inserted into expansion socket 1302. As illustrated in FIG. 13, interface adapter 600(3) may be installed by inserting into expansion socket 1302 and/or removed by pulling out of expansion socket 1302. Although illustrated as a single entity, expansion socket 1302 may represent multiple sockets each dimensioned to accept edge connector 202 of interface adapter 600, as shown in FIG. 7. In additional embodiments, edge connectors of interface adapters 600(1)-(3) may couple modular computing components on interface adapters 600(1)-(3) to a computing bus that connects expansion socket 1302 to the central processing unit. Thus, the modular computing components may be electronically coupled to computing system 1300.

Figure 14:
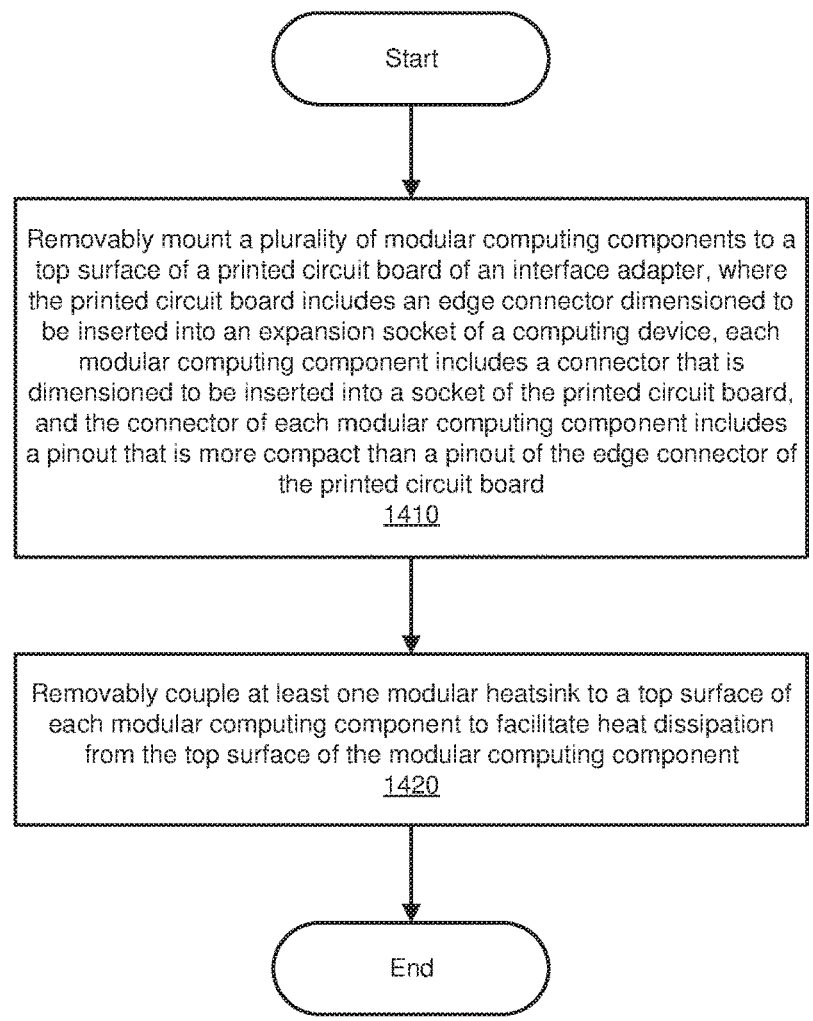
FIG. 14 is a flow diagram of an exemplary method for dissipating heat from expansion components.

FIG. 14 shows an example method for manufacturing, assembling, using, adjusting, or otherwise configuring or creating the systems and apparatuses presented herein. The steps shown in FIG. 14 may be performed by any individual and/or by any suitable type or form of manual and/or automated apparatus. In particular, FIG. 14 illustrates a flow diagram of an exemplary method 1400 for assembling an interface adapter.

As shown in FIG. 14, at step 1410, a plurality of modular computing components may be removably mounted to a top surface of a printed circuit board of an interface adapter. In some examples, the printed circuit board may include an edge connector dimensioned to be inserted into an expansion socket of a computing device. In these examples, each modular computing component may include a connector that is dimensioned to be inserted into a socket of the printed circuit board, and the connector of each modular computing component may include a pinout that is more compact than a pinout of the edge connector of the printed circuit board. For example, as illustrated in FIG. 9, modular computing components 100(1) and 100(2) may be removably mounted to printed circuit board 602 of interface adapter 600. Modular computing component 100(2) may include connector 102 that is dimensioned to be inserted into socket 504(2), and connector 102 may include a pinout that is more compact than the pinout of edge connector 202, which may be dimensioned to be inserted into an expansion socket, such as expansion socket 1302 in FIG. 13.

In one embodiment, each of the plurality of modular computing components above may include an expansion card designed to perform a specific computing task and one or more thermal pads coupled to the expansion card to facilitate heat dissipation from the expansion card. For example, as shown in FIG. 1, modular computing component 100 may include expansion card 104 and thermal pads 106 designed to facilitate heat dissipation away from expansion card 104.

At step 1420, one or more modular heatsinks may be removably coupled to a top surface of each modular computing component to facilitate heat dissipation from the top surface of each modular computing component. Furthermore, removably coupling the modular heatsink to the top surface of each modular computing component may include inserting a protrusion at a distal end of the modular heatsink to a slot in a distal mounting bracket on the printed circuit board and locking a latch at a proximal end of the modular heatsink to a proximal mounting bracket on the printed circuit board. For example, as illustrated in FIG. 6, modular heatsink 300 may be coupled to modular computing component 100 by inserting protrusion 302 into distal mounting bracket 604 on printed circuit board 602 and then locking latch 304 to proximal mounting bracket 502.

In some embodiments, method 1400 may further include a step in which a secondary heatsink may be coupled to a bottom surface of the printed circuit board to facilitate heat dissipation from bottom surfaces of the plurality of modular computing components. In these embodiments, a plurality of thermal vias may be dimensioned as through holes in the printed circuit board to transfer heat from the bottom surfaces of the plurality of modular computing components to the secondary heatsink. As shown in FIG. 10, secondary heatsink 606 may be coupled to the bottom of printed circuit board 602 to facilitate heat dissipation from modular computing components like modular computing component 100. In this example, as illustrated in FIG. 12, printed circuit board 602 may be dimensioned with plurality of thermal vias 1202 to further facilitate heat dissipation from modular computing components through printed circuit board 602 to secondary heatsink 606.

As discussed throughout the instant disclosure, the disclosed methods, systems, and apparatuses may provide one or more advantages over traditional mounting of expansion components. For example, the interface adapters described herein may mount multiple expansion cards of various types and provide electronic connections to an expansion socket of a computing system. Additionally, by mounting modular heatsinks over each expansion card using latches, the systems described herein may enable tool-less installation of heatsinks that provide compact, customized heat dissipation for individual expansion components. A secondary heatsink mounted to the bottom of the interface adapters described herein may provide additional heat dissipation for the expansion components. Furthermore, dimensioning a protrusion of the modular heatsinks to fit under expansion components may improve the removal of a single expansion component without disturbing other components. Thus, the mechanisms described herein may provide better heat dissipation and installation of expansion components in a computing system.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An interface adapter comprising:
    a printed circuit board comprising an edge connector that is dimensioned to be inserted into an expansion socket of a computing device;
    a plurality of modular computing components removably mounted to a top surface of the printed circuit board, wherein:
        each modular computing component comprises a connector that is dimensioned to be inserted into a socket of the printed circuit board; and
        the connector of each modular computing component comprises a pinout that is more compact than a pinout of the edge connector of the printed circuit board; and
    at least one modular heatsink coupled to a top surface of each modular computing component to facilitate heat dissipation from the top surface of the modular computing component, wherein a protrusion at a distal end of the modular heatsink is dimensioned to such that the protrusion provides leverage to lift a single modular computing component for removal.

2. The interface adapter of claim 1, wherein each modular computing component comprises:
    an expansion card designed to perform a specific computing task; and
    at least one thermal pad coupled to the expansion card to facilitate heat dissipation from the expansion card.

3. The interface adapter of claim 1, wherein the modular heatsink is coupled to the top surface of the modular computing component by:
  inserting the protrusion at the distal end of the modular heatsink to a slot in a distal mounting bracket on the printed circuit board; and
  locking a latch at a proximal end of the modular heatsink to a proximal mounting bracket on the printed circuit board.

4. The interface adapter of claim 3, wherein the latch at the proximal end of the modular heatsink comprises:
  a handle that fits to a ledge of the proximal mounting bracket to lock the latch; and
  a compression spring in the latch that exerts a tension between the handle and the modular heatsink to maintain a locked position of the latch.

5. The interface adapter of claim 4, wherein a force applied horizontally to the handle compresses the compression spring such that the handle unlocks from the ledge of the proximal mounting bracket for removal of the modular heatsink.

6. The interface adapter of claim 1, wherein a secondary heatsink is coupled to a bottom surface of the printed circuit board to facilitate heat dissipation from bottom surfaces of the plurality of modular computing components.

7. The interface adapter of claim 6, wherein a plurality of thermal vias, dimensioned as through holes in the printed circuit board, transfers heat from the bottom surfaces of the plurality of modular computing components to the secondary heatsink.

8. A computing system comprising:
  a central processing unit;
  at least one expansion socket; and
  at least one interface adapter with an edge connector that is dimensioned to be inserted into the expansion socket, wherein the interface adapter comprises:
    a plurality of modular computing components removably mounted to a printed circuit board of the interface adapter; and
    at least one modular heatsink coupled to a top surface of each modular computing component to facilitate heat dissipation from the top surface of the modular computing component, wherein a protrusion at a distal end of the modular heatsink is dimensioned to such that the protrusion provides leverage to lift a single modular computing component for removal.

9. The computing system of claim 8, wherein the edge connector of the interface adapter couples the plurality of modular computing components to a computing bus that connects the expansion socket to the central processing unit.

10. The computing system of claim 8, wherein each modular computing component comprises:
  an expansion card designed to perform a specific computing task;
  at least one thermal pad coupled to the expansion card to facilitate heat dissipation from the expansion card; and
  a connector that is dimensioned to be inserted into a socket of the printed circuit board.

11. The computing system of claim 10, wherein the connector of each modular computing component comprises a pinout that is more compact than a pinout of the edge connector of the interface adapter.

12. The computing system of claim 8, wherein the modular heatsink is coupled to the top surface of the modular computing component by:
  inserting the protrusion at the distal end of the modular heatsink to a slot in a distal mounting bracket on the interface adapter; and
  locking a latch at a proximal end of the modular heatsink to a proximal mounting bracket on the interface adapter.

13. The computing system of claim 8, wherein a secondary heatsink is coupled to a bottom surface of the interface adapter to facilitate heat dissipation from bottom surfaces of the plurality of modular computing components.

14. The computing system of claim 13, wherein a plurality of thermal vias, dimensioned as through holes in the printed circuit board of the interface adapter, transfers heat from the bottom surfaces of the plurality of modular computing components to the secondary heatsink.

15. A method comprising:
  removably mounting a plurality of modular computing components to a top surface of a printed circuit board of an interface adapter, wherein:
    the printed circuit board comprises an edge connector dimensioned to be inserted into an expansion socket of a computing device;
    each modular computing component comprises a connector that is dimensioned to be inserted into a socket of the printed circuit board; and
    the connector of each modular computing component comprises a pinout that is more compact than a pinout of the edge connector of the printed circuit board; and
  removably coupling at least one modular heatsink to a top surface of each modular computing component to facilitate heat dissipation from the top surface of the modular computing component, wherein a protrusion at a distal end of the modular heatsink is such that the protrusion provides leverage to lift a single modular computing component for removal.

16. The method of claim 15, wherein each modular computing component comprises:
  an expansion card designed to perform a specific computing task; and
  at least one thermal pad coupled to the expansion card to facilitate heat dissipation from the expansion card.

17. The method of claim 15, wherein removably coupling the modular heatsink to the top surface of each modular computing component comprises:
  inserting the protrusion at the distal end of the modular heatsink to a slot in a distal mounting bracket on the printed circuit board; and
  locking a latch at a proximal end of the modular heatsink to a proximal mounting bracket on the printed circuit board.

18. The method of claim 15, further comprising coupling a secondary heatsink to a bottom surface of the printed circuit board to facilitate heat dissipation from bottom surfaces of the plurality of modular computing components.

19. The method of claim 18, further comprising dimensioning a plurality of thermal vias as through holes in the printed circuit board to transfer heat from the bottom surfaces of the plurality of modular computing components to the secondary heatsink.

* * * * *